United States Patent
Totani et al.

(10) Patent No.: US 8,735,924 B2
(45) Date of Patent: May 27, 2014

(54) GROUP III NITRIDE SEMICONDUCTOR LIGHT-EMITTING DEVICE

(75) Inventors: Shingo Totani, Kiyosu (JP); Kosuke Yahata, Kiyosu (JP); Yuya Ishiguro, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 6 days.

(21) Appl. No.: 13/423,015

(22) Filed: Mar. 16, 2012

(65) Prior Publication Data
US 2012/0241791 A1  Sep. 27, 2012

(30) Foreign Application Priority Data

Mar. 21, 2011 (JP) .................................. 2011-061858
Oct. 21, 2011 (JP) .................................. 2011-231453

(51) Int. Cl.
*H01L 33/46* (2010.01)

(52) U.S. Cl.
USPC ............. 257/98; 257/E33.063; 257/E33.064; 257/E33.065; 257/E33.069; 257/13

(58) Field of Classification Search
USPC ............. 257/13, E33.063, E33.064, E33.065, 257/E33.068, 98
See application file for complete search history.

(56) References Cited

U.S. PATENT DOCUMENTS

| | | | |
|---|---|---|---|
| 6,914,268 B2 * | 7/2005 | Shei et al. | 257/99 |
| 7,291,865 B2 * | 11/2007 | Kojima et al. | 257/98 |
| 7,335,916 B2 * | 2/2008 | Kim et al. | 257/70 |
| 7,498,185 B2 * | 3/2009 | Tsai et al. | 438/26 |
| 8,026,527 B2 * | 9/2011 | Hasnain et al. | 257/98 |
| 8,247,823 B2 * | 8/2012 | Yahata et al. | 257/79 |
| 8,338,848 B2 * | 12/2012 | Hasnain et al. | 257/98 |
| 2005/0211989 A1 | 9/2005 | Horio et al. | |
| 2010/0012968 A1 | 1/2010 | Yahata et al. | |
| 2011/0018024 A1 * | 1/2011 | Fukshima et al. | 257/98 |
| 2012/0248406 A1 * | 10/2012 | Yahata et al. | 257/13 |

FOREIGN PATENT DOCUMENTS

JP  2005-302747 A  10/2005
JP  2010-027824 A  2/2010

* cited by examiner

*Primary Examiner* — Matthew W Such
*Assistant Examiner* — Stephen C Smith
(74) *Attorney, Agent, or Firm* — McGinn IP Law Group, PLLC (57) ABSTRACT

A Group III nitride semiconductor light-emitting device having an Ag or Ag alloy reflective film provided in an insulating film, at least a portion of the reflective film is located via the insulating film in a region between an n-lead electrode and at least one of a p-contact electrode having transparency and a p-type layer, wherein a conductive film is formed via the insulating film between the n-lead electrode and the reflective film of the region, and the conductive film is electrically connected to at least one of the p-contact electrode and the p-type layer.

21 Claims, 7 Drawing Sheets

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device having an Ag or Ag-containing alloy reflective film in an insulating film.

2. Background Art

Japanese Patent Applications Laid-Open (kokai) Nos. 2005-302747 and 2010-27824 disclose a flip-chip type Group III nitride semiconductor light-emitting device in which a reflective film formed of Ag or Ag alloy is provided in an insulating film. In such a light-emitting device, the light emitted from a light-emitting layer to a p-type layer side is reflected to an n-type layer side by the reflective film, and thereby light extraction performance is improved. Since Ag migration easily occurs, the reflective film is enclosed with the insulating film so that Ag migration is prevented.

However, studies by the present inventors have shown that even when the reflective film is provided in and insulated by the insulating film, migration occurs in the reflective film provided via the insulating film in a region between a p-electrode and an n-lead electrode due to a potential difference between the p-electrode and the n-lead electrode.

SUMMARY OF THE INVENTION

In view of the foregoing, an object of the present invention is to prevent migration in the Ag or Ag alloy reflective film provided in the insulating film.

In a first aspect of the present invention, there is provided a Group III nitride semiconductor light-emitting device having an Ag or Ag alloy reflective film provided in an insulating film, at least a portion of the reflective film is located via the insulating film in a region between an n-lead electrode and at least one of a p-contact electrode having transparency and a p-type layer, wherein a conductive film is formed via the insulating film between the n-lead electrode and the reflective film of the region, and the conductive film is electrically connected to at least one of the p-contact electrode and the p-type layer.

The conductive film may be formed of any conductive material, preferably, a material having a good adhesion with the insulating film. The material of the reflective film may be, for example, Al, Ti, Cr, or ITO. The p-contact electrode is an electrode which directly comes into contact with the p-type layer, and may be formed of any material having transparency for the emission wavelength of the Group III nitride semiconductor light-emitting device. For example, the electrode may be formed of an electrically conductive transparent oxide such as ITO (IndiumTinOxide), ICO (IndiumCeriumOxide), or IZO (IndiumZincOxide), or a metal thin film such as Au thin film.

The connection of the conductive film and at least one of the p-contact electrode and the p-type layer is not limited to direct connection, but may be indirect connection. The connection can be realized by connecting the conductive film and a p-lead electrode which is provided for connecting to at least one of the p-contact electrode and the p-type layer. Or the connection can be realized by connecting the conductive film and an intermediate electrode which is provided as a part of the p-contact electrode between the p-contact electrode and the p-lead electrode.

The conductive film is preferably formed in a same or larger area (on a plan view) than that of the reflective film provided via the insulating film between the n-lead electrode and at least one of the p-contact electrode and the p-type layer. An equipotential region becomes larger, and thereby migration in the reflective film is further prevented.

The reflective film may be a single-layer film or a multilayer film. In order to improve adhesion of the reflective film to the insulating film, a film formed of, for example, Ti may be provided between the insulating film and the reflective film.

In a second aspect of the present invention is drawn to a specific embodiment of the Group III nitride semiconductor light-emitting device according to the first aspect of the invention, wherein the p-contact electrode comprises ITO.

In a third aspect of the present invention is drawn to a specific embodiment of the Group III nitride semiconductor light-emitting device according to the first or second aspect of the invention, wherein the p-contact electrode has an intermediate electrode as a part of it, and the conductive film is connected to the p-contact electrode via the intermediate electrode.

In a fourth aspect of the present invention is drawn to a specific embodiment of the Group III nitride semiconductor light-emitting device according to any of the first to third aspects of the invention, wherein the conductive film is formed in a same or larger than an area including an orthogonal projection of the n-lead electrode on a plane view.

In a fifth aspect of the present invention is drawn to a specific embodiment of the Group III nitride semiconductor light-emitting device according to any of the first to third aspects of the invention, wherein the conductive film is formed in a same or larger than an area including an orthogonal projection of the reflective film on a plane view.

In a sixth aspect of the present invention is drawn to a specific embodiment of the Group III nitride semiconductor light-emitting device according to any of the first to fifth aspects of the invention, wherein a p-lead electrode is provided for connecting to at least one of the p-contact electrode and the p-type layer, and the conductive film is connected to at least one of the p-contact electrode and the p-type layer via the p-lead electrode by connecting the conductive film to the p-lead electrode.

In a seventh aspect of the present invention is drawn to a specific embodiment of the Group III nitride semiconductor light-emitting device according to any of the first to sixth aspects of the invention, wherein the conductive film comprises at least one of Al, Ti, Cr, and ITO.

In an eighth aspect of the present invention is drawn to a specific embodiment of the Group III nitride semiconductor light-emitting device according to any of the first to seventh aspects of the invention, wherein the light-emitting device is of a flip-chip type.

According to the present invention, since a conductive film is provided in the insulating film in a region between the reflective film and the n-lead electrode, and the conductive film is connected to at least one of the p-type layer and the p-contact electrode, the reflective film in a region between at least one of the p-type layer and the p-contact electrode and the n-lead electrode is located in an equipotential region, and thereby migration in the reflective film can be prevented.

The present invention is effective particularly for a flip-chip-type device because the flip-chip-type device must have a structure in which the reflective film is provided via the insulating film even in a region between at least one of the p-electrode and the p-type layer and the n-lead electrode.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1A:
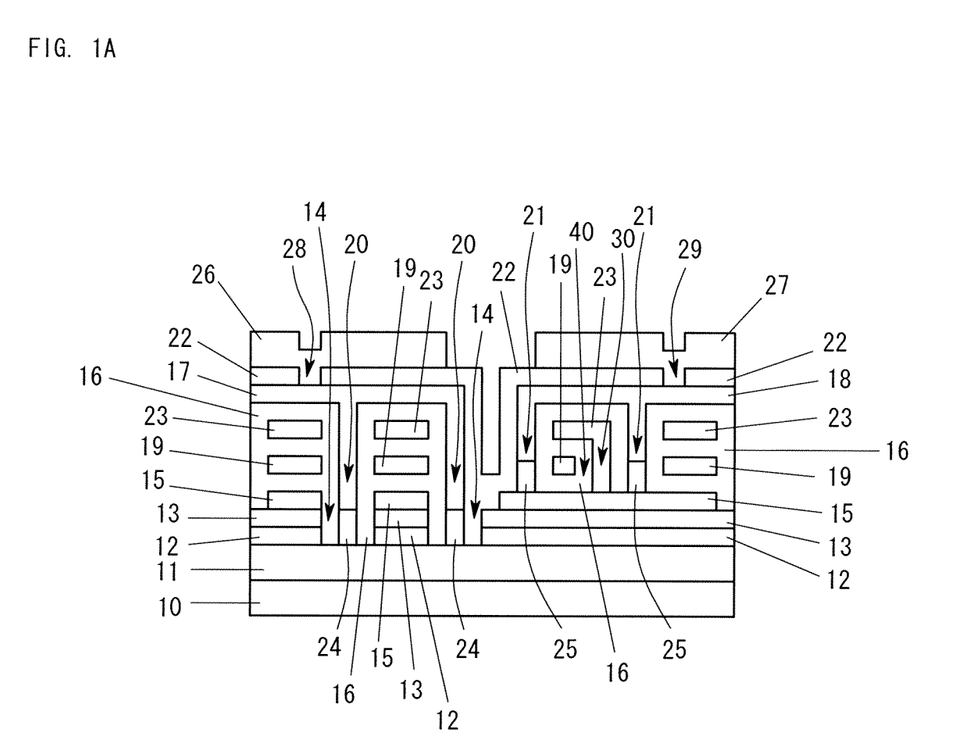
FIGS. 1A and 1B are a vertical cross-sectional view and a horizontal cross-sectional view of the configuration of a Group III nitride semiconductor light-emitting device 1 according to Embodiment 1, respectively.
Figure 1B:
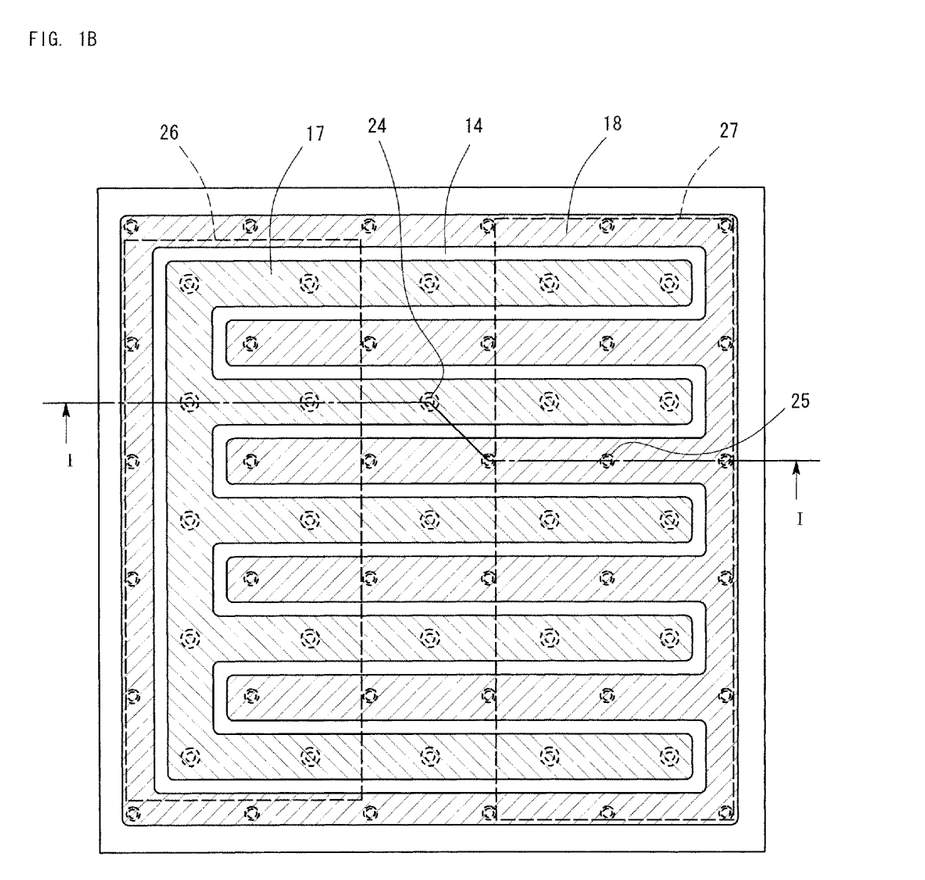

FIGS. 1A and 1B are a vertical cross-sectional view and a horizontal cross-sectional view of a Group III nitride semiconductor light-emitting device according to Embodiment 1, respectively. As shown in FIG. 1A, the Group III nitride semiconductor light-emitting device according to Embodiment 1 is of a flip-chip type, including a sapphire substrate 10; and an n-type layer 11, a light-emitting layer 12, and a p-type layer 13, which are sequentially deposited on the sapphire substrate 10. Each of the n-type layer 11, the light-emitting layer 12, and the p-type layer 13 may have any of conventionally known structures. The n-type layer 11 may have, for example, a structure in which an n-contact layer, an ESD layer, and an n-cladding layer are sequentially deposited on the sapphire substrate 10. The light-emitting layer 12 may have, for example, an MQW structure in which InGaN well layers and GaN barrier layers are alternately deposited. The p-type layer 13 may have, for example, a structure in which a p-cladding layer and a p-contact layer are sequentially deposited on the light-emitting layer 12. On the surface of the p-type layer 13, there are provided a plurality of holes 14 having a depth extending from the top surface of the p-type layer 13 to the n-type layer 11 (to the n-contact layer in the case where the n-type layer 11 has a layered structure, the same shall apply hereinafter). Also, an ITO (IndiumTinOxide) electrode 15 having a continuous plane is formed on almost the entire top surface of the p-type layer 13 other than the regions provided with the holes 14 like a cylinder. The ITO electrode 15 is a p-contact electrode which comes into contact with the p-type layer 13, and is transparent for the emission wavelength of the device. Moreover, an $SiO_2$ insulating film 16 is provided so as to continuously cover the surface of the ITO electrode 15, and the side surfaces and bottom surface of the holes 14, and the surfaces of the p-type layer 13 on which the ITO electrode 15 is not formed. The insulating film 16 may be formed of, in place of $SiO_2$, an insulating material exhibiting transparency for the emission wavelength of the Group III nitride semiconductor light-emitting device, such as $Si_3N_4$, $Al_2O_3$, or $TiO_2$.

On the insulating film 16 (i.e., the surface of the insulating film 16 on the side opposite the sapphire substrate 10), an n-lead electrode 17 and a p-lead electrode 18 are formed like a figure of two combs on a plane which are engaged with a space each other as shown in FIG. 1B. The n-lead electrode 17 and the p-lead electrode 18 have a wiring pattern like a comb extending from a respective common base in a direction parallel to the main surface of the device. The insulating film 16 has holes 20 and 21 like a cylinder for exposing the n-type layer 11 (the n-contact layer in the case where the n-type layer 11 has a layered structure) and the ITO electrode 15, respectively. The n-lead electrode 17 comes into contact with the n-type layer 11 via n-intermediate electrodes 24 through the holes 20, and the p-lead electrode 18 comes into contact with the ITO electrode 15 via a p-intermediate electrode 25 through the holes 21. The n-intermediate electrode 24 is an n-contact electrode which comes into contact with the n-type layer 11. Each of the n-intermediate electrodes 24 and each of the p-intermediate electrodes 25 has a three-layered structure of Ni/Au/Al in which an Ni film, an Au film, and an Al film are sequentially deposited on the n-type layer 11 and the ITO electrode 15, respectively. Here the symbol "/" refers to a layered structure; for example, "A/B" refers to a layered structure in which layer B is formed after formation of layer A (the same shall apply hereinafter). The Ni film has a thickness of 50 nm, the Au film has a thickness of 1,500 nm, and the Al film has a thickness of 10 nm.

The insulating film 16A incorporates therein the reflective film 19 like a continuous plane without the portions corresponding to the holes 14 and the areas including the holes 21. The reflective film 19 has a three-layered structure of Al/Ag/Al, and the Al layer has a thickness of 1 Å to 30 Å. The reflective film 19 is enclosed with the insulating film 16, and thereby metal migration in the reflective film 19 is suppressed. The reason why the reflective film 19 has not a single-layer structure but a structure in which the Ag layer is sandwiched between the Al layers is to prevent Ag migration by placing Ag between layers of Al having a larger ionization tendency than Ag. The material of the reflective film 19 is not limited to Al/Ag/Al so long as including Ag or Ag alloy, e.g., the reflective film 19 may be a single-layer film formed of Ag or Ag alloy, or a multi-layer film including an Ag or Ag alloy layer.

The insulating film 16 includes therein a conductive film 23 on specific regions approximately corresponding to an orthogonal projection of the reflective film 19 above the reflective film 19 (i.e., the side opposite the ITO electrode 15 side). That is the conductive film 23 is a continuous plane without the portions corresponding to the holes 14 and the areas including the holes 21. The conductive film 23 may be formed of any conductive material, preferably, a material having a good adhesion with the insulating film 16. For example, Al, Ti, Cr, or ITO may be employed. Also, one or a plurality of portions of the conductive film 23 comes into contact with the ITO electrode 15 through the holes 40 like a cylinder formed in the reflective film 19. Although the contact can be made at any position, the total area of the contact is preferably as small as possible so that light extraction performance is not reduced. That is because the larger the total area of the contact becomes, the smaller the area of the reflective film 19. The conductive film 23 also may partially come into contact with the reflective film 19.

The n-lead electrode 17 and the p-lead electrode 18 are covered with an insulating film 22. Solder layers 26 and 27 are formed on the insulating film 22 above the n-lead electrode 17 and the p-lead electrode 18 as shown in FIGS. 1A and 1B (i.e., the surface on the side opposite the sapphire substrate 10). The insulating film 22 has holes 28 and 29 for exposing the n-lead electrode 17 and the p-lead electrode 18 at the bottom of the holes, respectively. Through the holes 28 and 29, the n-lead electrode 17 is connected to the solder layer 26, and the p-lead electrode 18 is connected to the solder layer 27. The solder layers 26 and 27 are formed of Ti/Ni/Au/AuSn/Au having a thickness of 100 nm, 150 nm, 50 nm, 5000 nm, and 50 nm, respectively.

The Group III nitride semiconductor light-emitting device according to Embodiment 1 is of a flip-chip type, in which a light is reflected to and extracted from the sapphire substrate by the reflective film 19 included in the insulating film 16. In the Group III nitride semiconductor light-emitting device according to Embodiment 1, since the conductive film 23 connected to the ITO electrode 15 was formed, the ITO electrode 15 and the conductive film 23 have almost the same potential. The reflective film 19 which is located in the region between the n-lead electrode 17 and the ITO electrode 15 via the insulating film 16 is also located between the conductive film 23 and the ITO electrode 15 via the insulating film 16. Therefore, the reflective film 19 in the region between the n-lead electrode 17 and the ITO electrode 15 via the insulating film 16 is located in an equipotential region, i.e., no electric field region. Thus, an electric field is not applied in the reflective film, and migration is prevented.

Figure 1C:
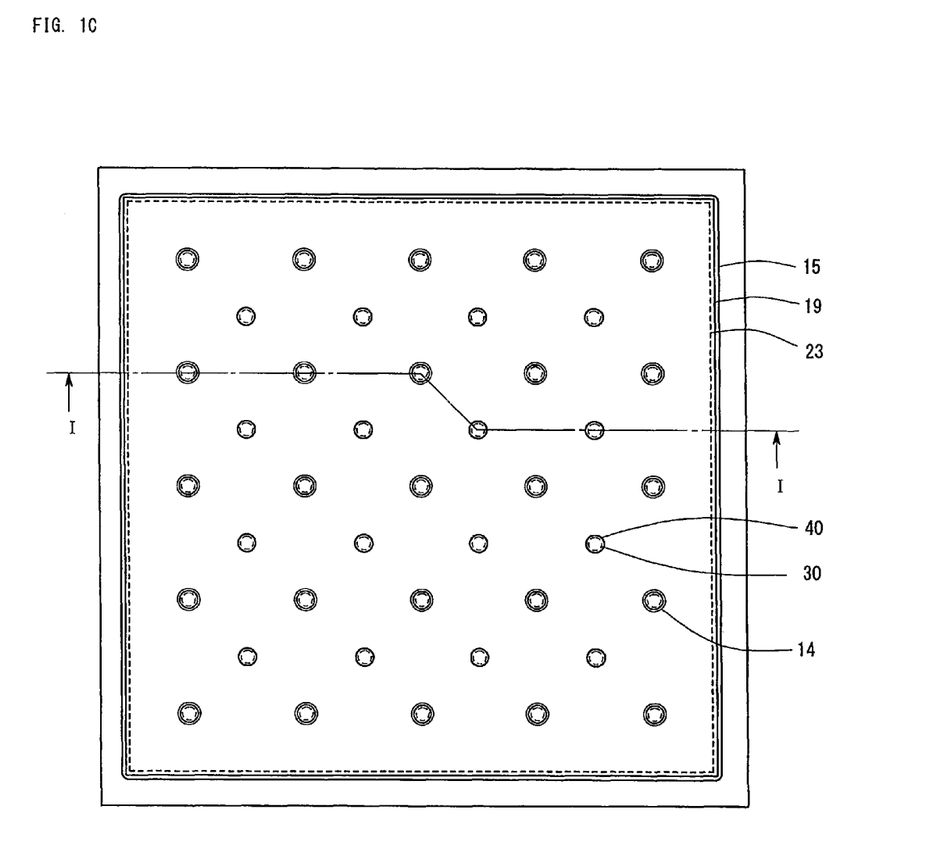
FIGS. 1C and 1D are plan views of the configuration of a Group III nitride semiconductor light-emitting device.
Figure 1D:
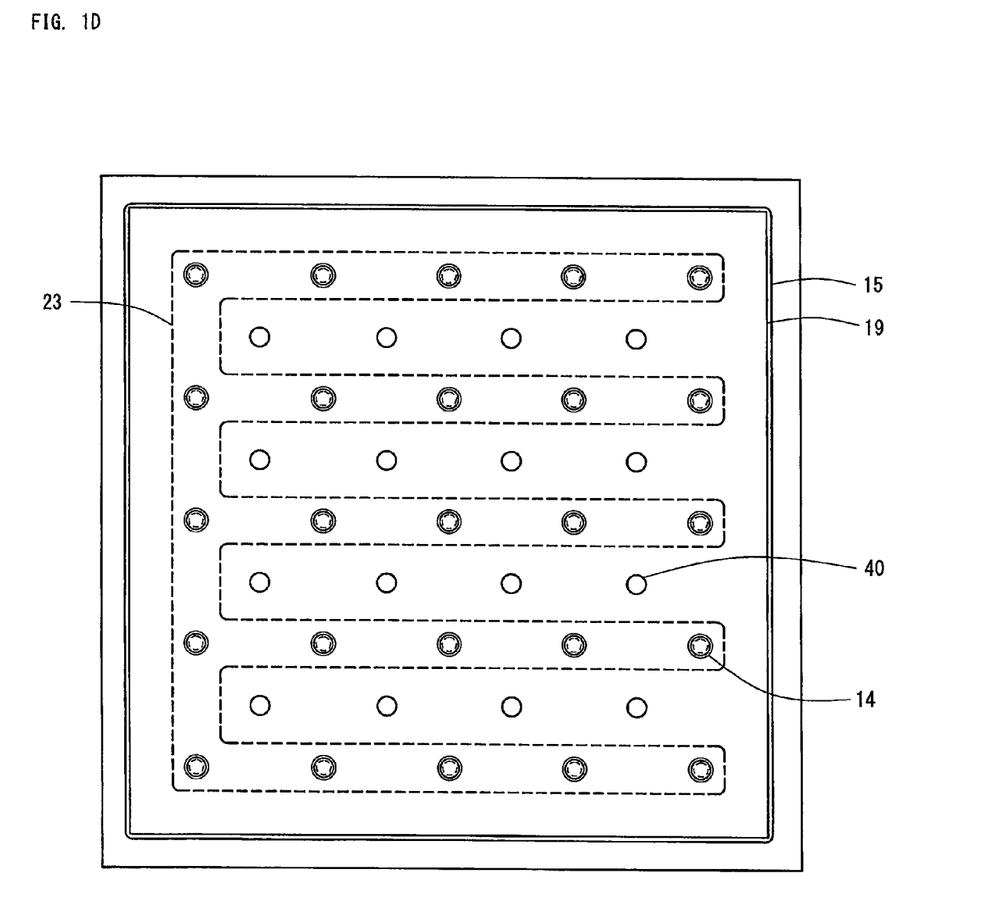

On the plane view the conductive film 23 is preferably formed in an area equal to that of the reflective film 19, i.e., the orthogonal projection of the reflective film 19. More preferably on the plane view the conductive film 23 is formed in an area including and larger than that of the reflective film 19, i.e., the area including the orthogonal projection of the reflective film 19. That is because the equipotential, i.e., no electric region becomes larger, the reflective film 19 is more reliably included in the equipotential region. Therefore, migration of the reflective film 19 can be further suppressed. FIG. 1C is a plane view showing the layered structure of an ITO electrode 15, a reflective film 19, and a conductive film 23. FIG. 1D shows the case where the conductive film 23 is the same as the area including an orthogonal projection of the n-lead electrode 17 on a plane view.

In the Group III nitride semiconductor light-emitting device according to Embodiment 1, the conductive film 23 is formed in the insulating film 16 on the area including the orthogonal projection of the reflective film 19 on a plane view. However, the conductive film 23 may be formed only in specific area corresponding to the area directly above the reflective film 19 and below the n-lead electrode 17. That is the conductive film 23 may be formed on the same area as the orthogonal projection of n-lead electrode 17 on a plane view. Also the conductive film 23 may be formed in the area larger than the projection area of n-lead electrode 17 on a plane view.

Figure 3:
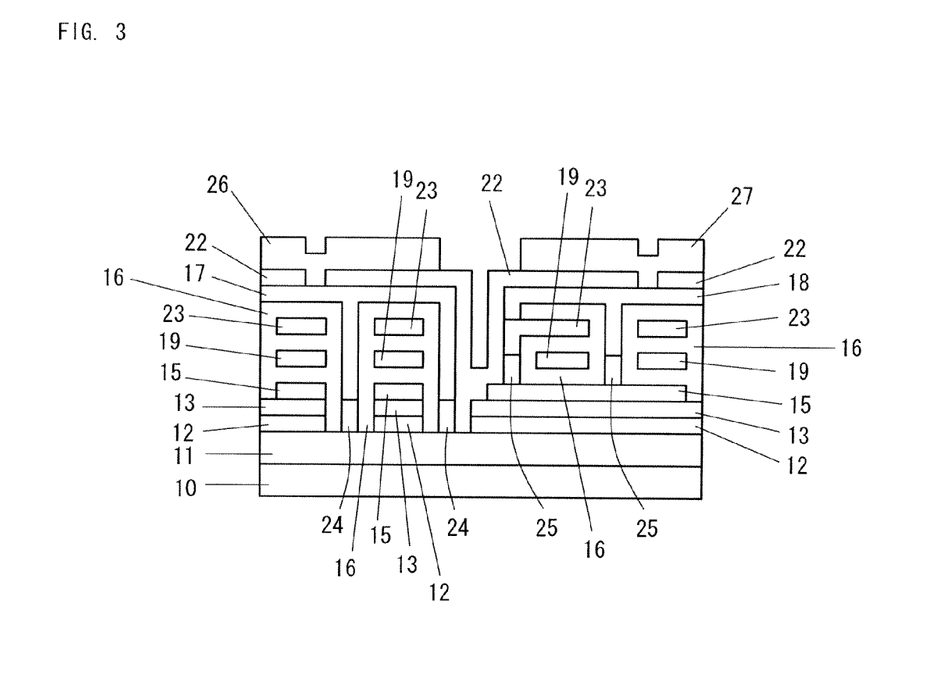
FIG. 3 shows the configuration of a Group III nitride semiconductor light-emitting device according to a modified example of Embodiment 1.
Figure 4:
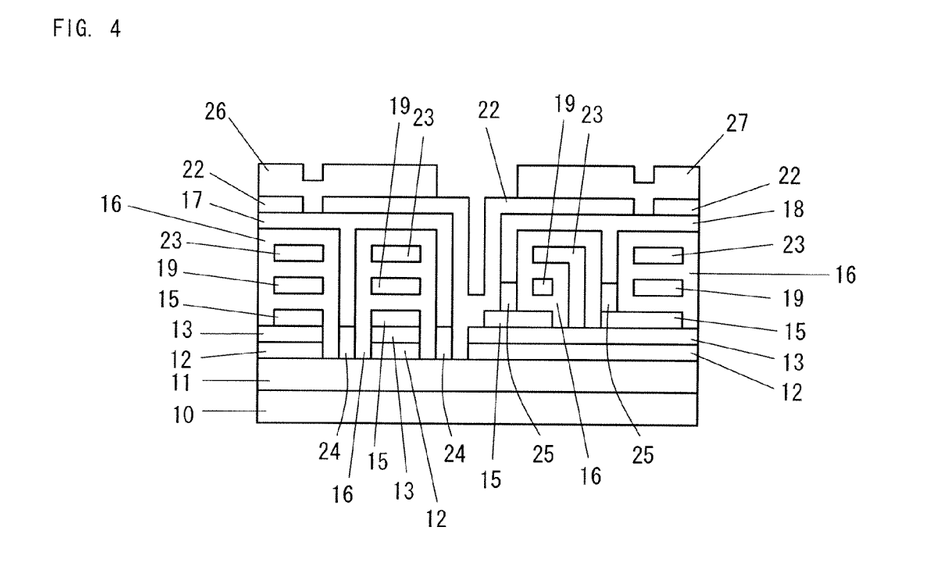
FIG. 4 shows the configuration of a Group III nitride semiconductor light-emitting device according to a modified example of Embodiment 1.
Figure 5:
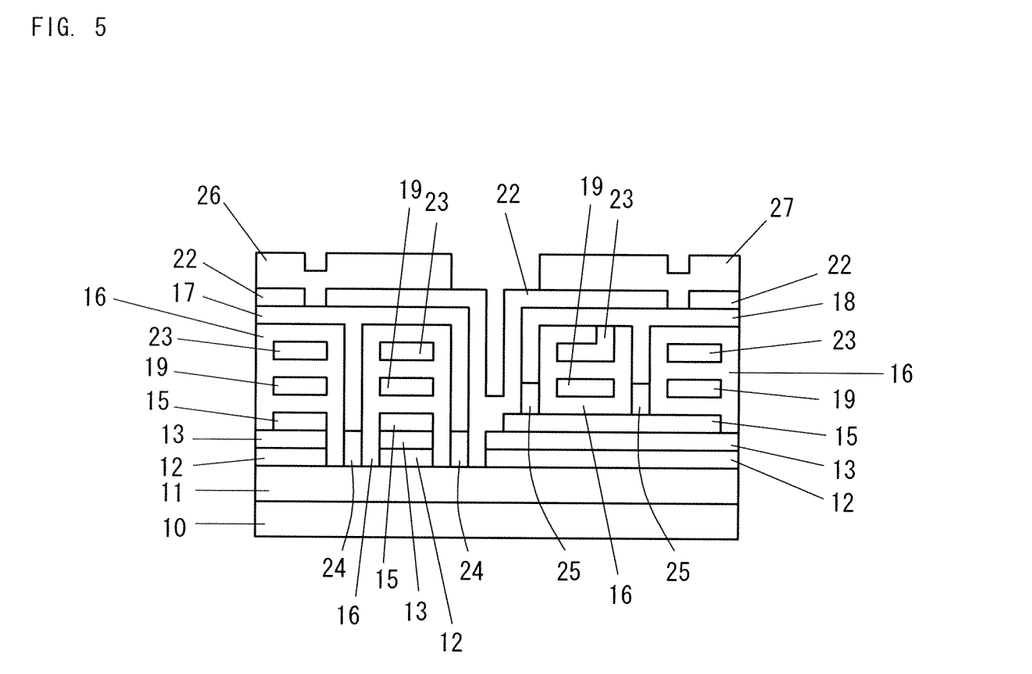
FIG. 5 shows the configuration of a Group III nitride semiconductor light-emitting device according to a modified example of Embodiment 1.

In the Group III nitride semiconductor light-emitting device according to Embodiment 1, a portion of the conductive film 23 is connected to the ITO electrode 15. However, the conductive film 23 may have any structure so long as it has almost the same potential as that of the p-lead electrode 18. For example, a portion of the conductive film 23 may be connected to the p-intermediate electrode 25 as shown in FIG. 3, a portion of the conductive film 23 may be connected to the p-type layer 13 as shown in FIG. 4, or a portion of the conductive film 23 may be connected to the p-lead electrode 18 as shown in FIG. 5. In each case, because the conductive film 23 is indirectly connected to the ITO electrode 15 or the p-type layer 13, the reflective film 19 exists in an equipotential region. Thus, migration can be prevented in the reflective film 19.

Next will be described processes for producing the Group III nitride semiconductor light-emitting device according to Embodiment 1 with reference to FIG. 2.

Figure 2A:
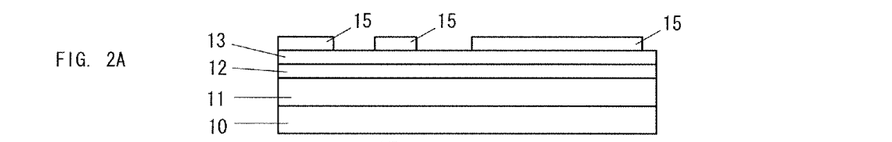
FIGS. 2A to 2F are sketches showing processes for producing the Group III nitride semiconductor light-emitting device according to Embodiment 1.

Firstly, an n-type layer 11, a light-emitting layer 12, and a p-type layer 13 are sequentially formed on a sapphire substrate 10 by MOCVD. The raw material gases employed for MOCVD are as follows: TMG (trimethylgallium) as a Ga source, TMI (trimethylindium) as an In source, TMA (trimethylaluminum) as an Al source, ammonia as a nitrogen source, silane as an n-type doping gas, cyclopentadienylmagnesium as a p-type doping gas, and hydrogen or nitrogen as a carrier gas. Then, ITO electrode 15 (thickness: 100 nm) is formed by vapor deposition on a portion of the p-type layer 13 (FIG. 2A).

Figure 2B:
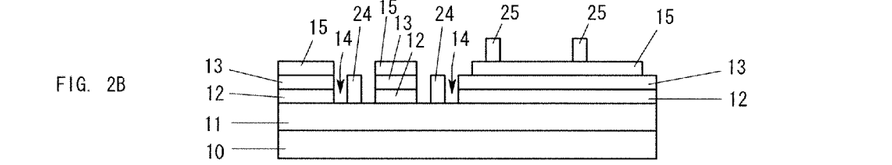

Subsequently, specific portions of the p-type layer 13 are subjected to photolithography and dry etching, to thereby form holes 14 like a cylinder having a depth extending from the top surface of the p-type layer 13 to the n-type layer 11. Then, n-intermediate electrodes 24 and p-intermediate electrodes 25 are formed, by vapor deposition and the lift-off process, on specific regions of the n-type layer 11 exposed through the bottom of the holes 14 and on specific regions of the ITO electrode 15, respectively, and followed by thermal treatment at 570° C. (FIG. 25).

Figure 2C:
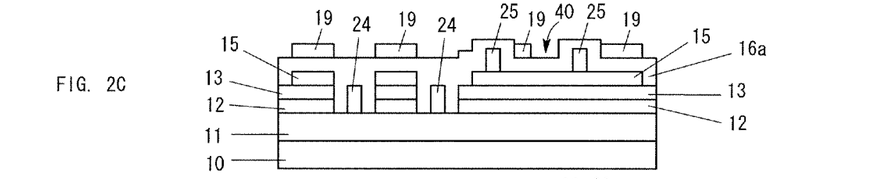

Next, a first insulating film 16a formed of SiO$_2$ having a thickness of 100 nm (a portion of the insulating film 16) is deposited by CVD so as to continuously cover the entire top surface, i.e., the surface of the ITO electrode 15, the bottom and side surfaces of the holes 14, the surfaces of the p-type layer 13 on which the ITO electrode 15 is not formed, the n-intermediate electrodes 24, and the p-intermediate electrodes 25. Then, a reflective film 19 is formed, which has a structure of Al/Ag/Al in which an Al film, an Ag film, and an Al film are sequentially deposited, by vapor deposition, on specific regions (other than the regions above the n-intermediate electrodes 24 and the p-intermediate electrodes 25 and the holes 40 for connecting the conductive film 23 to the ITO electrode 15) of the first insulating film 16a (FIG. 2C). The Al film has a thickness of 1 Å to 30 Å, and the Ag film has a thickness of 500 Å to 5,000 Å.

Figure 2D:
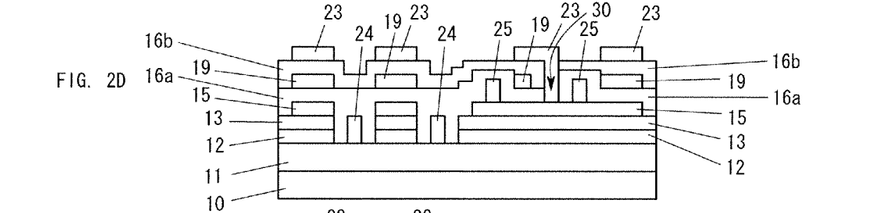

Subsequently, a second insulating film 16b formed of SiO$_2$ having a thickness of 100 nm (a portion of the insulating film 16) is deposited on the first insulating film 16a and on the reflective film 19 by CVD. Thus, the reflective film 19 is enclosed between the first insulating film 16a and the second insulating film 16b. Subsequently, specific regions of the first and second insulating films 16a and 16b (corresponding to regions below which the reflective film 19, the n-intermediate electrode 24, or the p-intermediate electrode 25 is not located) are subjected to dry etching, to thereby form holes 30 like a cylinder so that the ITO electrode 15 is exposed through the bottom of the holes 30. Then, conductive film 23 is deposited by vapor deposition and the lift-off process so as to continuously cover the second insulating film 16b above the reflective film 19 and to fill the holes 30 (FIG. 2D). Thus, the conductive film 23 and the ITO electrode 15 are connected through the holes 30.

Figure 2E:
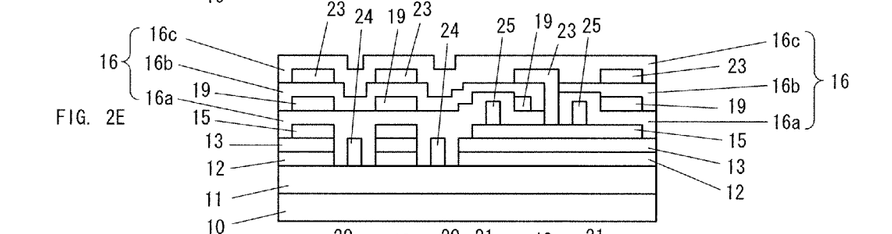

Next, a third insulating film 16c formed of SiO$_2$ having a thickness of 100 nm (a portion of the insulating film 16) is deposited on the second insulating film 16b and on the conductive film 23 by CVD. The first insulating film 16a, the second insulating film 16b, and the third insulating film 16c together form an insulating film 16 (FIG. 2E).

Figure 2F:
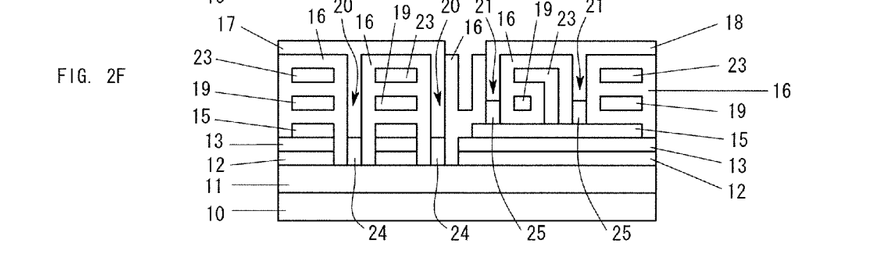

Subsequently, portions of the insulating film 16 corresponding to the tops of the n-intermediate electrodes 24 and the p-intermediate electrodes 25 are subjected to dry etching, to thereby form holes 20 and 21 for exposing the n-intermediate electrodes 24 and the p-intermediate electrodes 25, respectively. After that, n-lead electrode 17 and p-lead electrode 18 having a Ti/Ni/Au/Al wiring pattern are formed, by vapor deposition and the lift-off process, on specific regions of the third insulating film 16c and the holes 20 and 21 (FIG. 2F). Thus, the n-lead electrode 17 is connected to the n-intermediate electrodes 24, and the p-lead electrode 18 is connected to the p-intermediate electrodes 25. The n-lead electrode 17 and the p-lead electrode 18 may be separately or simultaneously formed.

Next, an additional insulating film 22 is deposited on the n-lead electrode 17 and the p-lead electrode 18 by CVD, and holes 28 and 29 are formed on specific regions of the insulating film 22 by dry etching as shown in FIG. 1A. Then, a solder layer 26 and a solder layer 27 are formed on regions of the insulating film 22 corresponding to the tops of the n-lead electrode 17 and the holes 28, and the tops of the p-lead electrode 18 and the holes 29. Through the holes 28, the n-lead electrode 17 is connected to the solder layer 26. Through the holes 29, the p-lead electrode 18 is connected to the solder layer 27. Thus, the Group III nitride semiconductor light-emitting device according to Embodiment 1, which is shown in FIG. 1A, is produced.

In the Group III nitride semiconductor light-emitting device according to Embodiment 1, the ITO electrode 15 is employed. However, the ITO electrode 15 may be replaced with an electrode formed of any material exhibiting transparency for the emission wavelength of the Group III nitride semiconductor light-emitting device and forming an ohmic contact with the p-type layer 13. For example, a metal thin film such as Co/Au thin film having a thickness of about 10 nm or an electrically conductive transparent oxide such as ICO (IndiumCeriumOxide) may be used.

In the Group III nitride semiconductor light-emitting device according to Embodiment 1, the insulating film 16 is formed of $SiO_2$. However, the insulating film may be formed of any insulating material exhibiting transparency for the emission wavelength of the Group III nitride semiconductor light-emitting device. For example, oxide such as $Al_2O_3$ or $TiO_2$, nitride such as $Si_3N_4$, or oxynitride such as $SiO_xN_y$ may be used.

In the Group III nitride semiconductor light-emitting device according to Embodiment 1, the n-type layer 11 is connected to the n-lead electrode 17 via the n-intermediate electrodes 24. However, the n-type layer 11 may be directly connected to the n-lead electrode 17 without the n-intermediate electrodes 24. Similarly, in the Group III nitride semiconductor light-emitting device according to Embodiment 1, the p-type layer 13 or the ITO electrode 15 is connected to the p-lead electrode 18 via the p-intermediate electrodes 25. However, the p-type layer 13 or the ITO electrode 15 may be directly connected to the p-lead electrode 18 without the p-intermediate electrodes 25.

Although the light-emitting device according to Embodiment 1 has a flip-chip-type structure, the light-emitting device of the present invention may have a flip-face-up-type structure.

The Group III nitride semiconductor light-emitting device of the present invention can be employed as a light source of an illumination apparatus, or a display apparatus.

What is claimed is:

1. A Group III nitride semiconductor light-emitting device, comprising:
   an n-type layer;
   a p-type layer formed above the n-type layer; and
   an Ag or an Ag alloy reflective film provided in an insulating film, at least a portion of the reflective film being located via the insulating film in a region between an n-lead electrode and at least one of a p-contact electrode having transparency and the p-type layer,
   wherein a conductive film is formed via the insulating film between the n-lead electrode and the reflective film of the region, and the conductive film is electrically connected to at least one of the p-contact electrode and the p-type layer, and
   wherein the reflective film is electrically isolated from the n-lead electrode by the insulating film, and with the n-lead electrode electrically insulated from the reflective film and the conductive film, the n-lead electrode passes through the reflective film and the conductive film, and is electrically connected to the n-type layer.

2. A Group III nitride semiconductor light-emitting device according to claim 1, wherein the p-contact electrode comprises an ITO electrode.

3. A Group III nitride semiconductor light-emitting device according to claim 1, wherein the p-contact electrode comprises an intermediate electrode, and the conductive film is connected to the p-contact electrode via the intermediate electrode.

4. A Group III nitride semiconductor light-emitting device according to claim 2, wherein the p-contact electrode comprises an intermediate electrode, and the conductive film is connected to the p-contact electrode via the intermediate electrode.

5. A Group III nitride semiconductor light-emitting device according to claim 1, wherein the conductive film is formed in a same or larger than an area including an orthogonal projection of the n-lead electrode on a plane view.

6. A Group III nitride semiconductor light-emitting device according to claim 2, wherein the conductive film is formed in a same or larger than an area including an orthogonal projection of the n-lead electrode on a plane view.

7. A Group III nitride semiconductor light-emitting device according to claim 3, wherein the conductive film is formed in a same or larger than an area including an orthogonal projection of the n-lead electrode on a plane view.

8. A Group III nitride semiconductor light-emitting device according to claim 4, wherein the conductive film is formed in a same or larger than an area including an orthogonal projection of the n-lead electrode on a plane view.

9. A Group III nitride semiconductor light-emitting device according to claim 1, wherein the conductive film is formed in a same or larger than an area including an orthogonal projection of the reflective film on a plane view.

10. A Group III nitride semiconductor light-emitting device according to claim 2, wherein the conductive film is formed in a same or larger than an area including an orthogonal projection of the reflective film on a plane view.

11. A Group III nitride semiconductor light-emitting device according to claim 3, wherein the conductive film is formed in a same or larger than an area including an orthogonal projection of the reflective film on a plane view.

12. A Group III nitride semiconductor light-emitting device according to claim 4, wherein the conductive film is formed in a same or larger than an area including an orthogonal projection of the reflective film on a plane view.

13. A Group III nitride semiconductor light-emitting device according to claim 1, wherein a p-lead electrode is provided for connecting to at least one of the p-contact electrode and the p-type layer, and the conductive film is connected to at least one of the p-contact electrode and the p-type layer via the p-lead electrode by connecting the conductive film to the p-lead electrode.

14. A Group III nitride semiconductor light-emitting device according to claim 1, wherein a p-lead electrode is provided for connecting to at least one of the p-contact electrode and the p-type layer, and the conductive film is connected to at least one of the p-contact electrode and the p-type layer via the p-lead electrode by connecting the conductive film to the p-lead electrode.

15. A Group III nitride semiconductor light-emitting device according to claim 5, wherein a p-lead electrode is provided for connecting to at least one of the p-contact electrode and the p-type layer, and the conductive film is connected to at least one of the p-contact electrode and the p-type layer via the p-lead electrode by connecting the conductive film to the p-lead electrode.

16. A Group III nitride semiconductor light-emitting device according to claim 9, wherein a p-lead electrode is provided for connecting to at least one of the p-contact electrode and the p-type layer, and the conductive film is connected to at least one of the p-contact electrode and the p-type layer via the p-lead electrode by connecting the conductive film to the p-lead electrode.

17. A Group III nitride semiconductor light-emitting device according to claim 1, wherein the conductive film comprises at least one of Al, Ti, Cr, and ITO.

18. A Group III nitride semiconductor light-emitting device according to claim 5, wherein the conductive film comprises at least one of Al, Ti, Cr, and ITO.

19. A Group III nitride semiconductor light-emitting device according to claim 9, wherein the conductive film comprises at least one of Al, Ti, Cr, and ITO.

20. A Group III nitride semiconductor light-emitting device according to claim 1, wherein the light-emitting device comprises a flip-chip type.

21. A Group III nitride semiconductor light-emitting device according to claim 1, wherein the reflective film is enclosed in the insulating film.

* * * * *